(12) United States Patent
Kondo

(10) Patent No.: US 7,140,529 B2
(45) Date of Patent: Nov. 28, 2006

(54) WIRE BONDING METHOD AND APPARATUS

(75) Inventor: Yutaka Kondo, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 11/061,270

(22) Filed: Feb. 17, 2005

(65) Prior Publication Data

US 2005/0184131 A1 Aug. 25, 2005

(30) Foreign Application Priority Data

Feb. 20, 2004 (JP) ............................. 2004-044575

(51) Int. Cl.
*B23K 37/00* (2006.01)
*B23K 20/00* (2006.01)
*B23K 31/02* (2006.01)

(52) U.S. Cl. ..................... 228/4.5; 228/180.5; 228/102

(58) Field of Classification Search ..................... None
See application file for complete search history.

(56) References Cited

U.S. PATENT DOCUMENTS 5,230,458 A * 7/1993 Asanasavest ................ 228/102
5,360,155 A * 11/1994 Ooki et al. ................... 228/1.1
5,377,894 A * 1/1995 Mizoguchi et al. .......... 228/1.1
6,871,772 B1 * 3/2005 Kyomasu et al. ............ 228/4.5
2002/0109001 A1 * 8/2002 Ou et al. ..................... 228/102
2003/0218050 A1 * 11/2003 Kanemoto et al. .......... 228/103
2004/0134965 A1 * 7/2004 Stepan ........................ 228/1.1

FOREIGN PATENT DOCUMENTS

JP 3245445 1/2002

* cited by examiner

*Primary Examiner*—Lynne R. Edmondson
(74) *Attorney, Agent, or Firm*—Koda & Androlia

(57) ABSTRACT

A wire bonding apparatus that include a piezoelectric element 4 provided near the capillary attachment portion of a bonding arm 1 so that a capillary 3 vibrates in the axial direction of the bonding arm 1, the piezoelectric element 4 being driven by a piezoelectric element driving power source 11. The wire bonding apparatus further includes a detector 15 and a bonding arm control circuit 16, wherein the detector 15 detects the voltage or current generated by the piezoelectric element 4 when the capillary 3 is lowered and contacts the object of bonding, and the bonding arm control circuit 16 controls the lowering motion of the bonding arm 1 in accordance with the changes in the voltage or current detected by this detector 15.

2 Claims, 2 Drawing Sheets

WIRE BONDING METHOD AND APPARATUS

BACKGROUND OF THE INVENTION

1. Technical Field

The present invention relates to a wire bonding method and apparatus that performs bonding work while causing the capillary to vibrate by means of a piezoelectric element.

2. Description of the Related Art

Japanese Patent No. 3245445 (Japanese Patent Application Laid-Open (Kokai) No. H5-275502) discloses n example of a wire bonding apparatus that causes the capillary to vibrate by means of a piezoelectric element. In this prior art, a piezoelectric element is provided in the vicinity of the capillary attachment portion of the bonding arm so that the capillary is caused to vibrate in the axial direction of the bonding arm.

In the above-described prior art, the piezoelectric element is used only to cause vibration of the capillary.

BRIEF SUMMARY OF THE INVENTION

The object of the present invention is to provide a wire bonding apparatus in which a piezoelectric element is endowed with a capillary contacting detection function which is a function other than making vibrations, so that the impact load at the time of contact of the bonding arm with an object of bonding is reduced.

The above object of the present invention is accomplished by a unique structure of the present invention for a wire bonding apparatus in which a piezoelectric element is provided in the vicinity of the capillary attachment portion of the bonding arm so that the capillary is caused to vibrate in the axial direction of the bonding arm, and the piezoelectric element is driven by a piezoelectric element driving power source; and in the present invention the wire bonding apparatus is comprised of:

a detector that detects the voltage or current generated by the piezoelectric element when the capillary is lowered and contacts the object of bonding, and a bonding arm control circuit that controls the lowering motion of the bonding arm in accordance with the changes in the voltage or current detected by the detector.

In the above structure of the wire bonding apparatus of the present invention, the wire bonding apparatus further includes a switching means that connects the piezoelectric element to the piezoelectric element driving power source after the changes in the voltage or current are detected by the detector.

The above object of the present invention is further accomplished by unique steps of the present invention for a wire bonding method that uses a piezoelectric element which is provided in the vicinity of the capillary attachment portion of the bonding arm so that the capillary is caused to vibrate in the axial direction of the bonding arm, the piezoelectric element being driven by a piezoelectric element driving power source; and in the present invention, the wire bonding method comprises the steps of:

detecting the voltage or current that is generated by the piezoelectric element when the capillary is lowered and contacts the object of bonding, gently lowering the bonding arm following the detection of the voltage or current, and executing bonding subsequently while applying a voltage to the piezoelectric element so as to vibrate the capillary In the bonding apparatus and method of the present invention, in addition to the function of transmitting a vibration to the capillary as a result of being driven by a piezoelectric element driving power source, the piezoelectric element transmits the voltage or current generated at the time of contact of the capillary with an object of bonding to the detector. Accordingly, the contact of the capillary with an object of bonding is instantaneously detected, and the impact load at the time of contact can be reduced.

DETAILED DESCRIPTION OF THE INVENTION

Figure 1A:
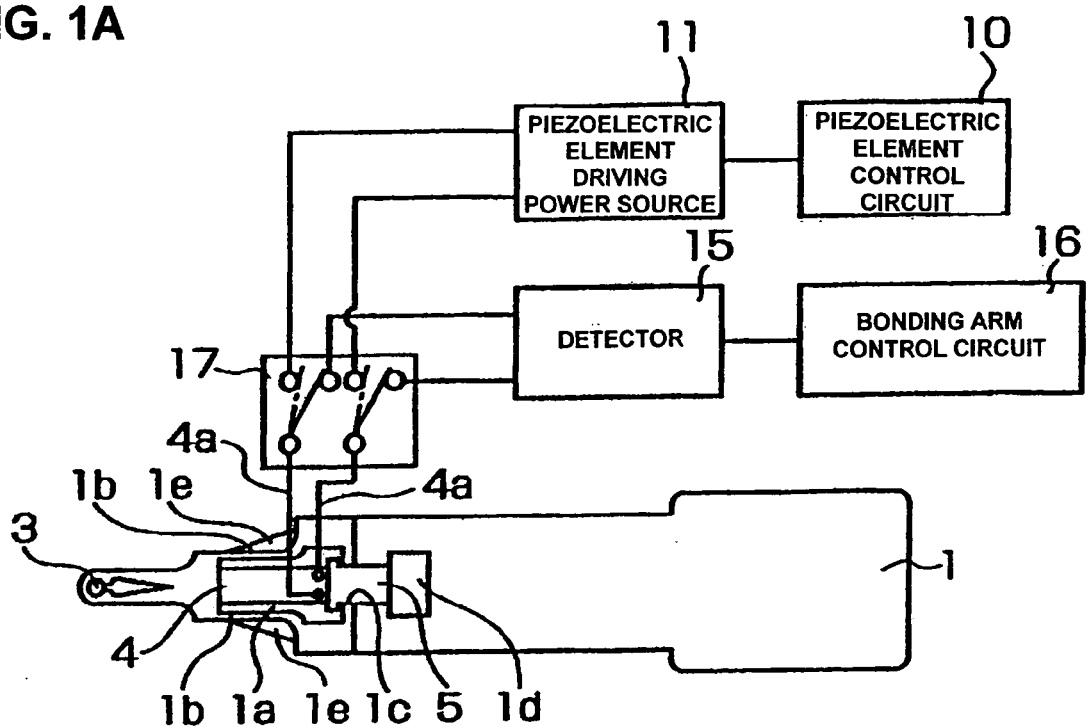
FIG. 1A is a top view of the essential portion of one embodiment of the wire bonding apparatus of the present invention with a block diagram of the control section shown together.
Figure 1B:
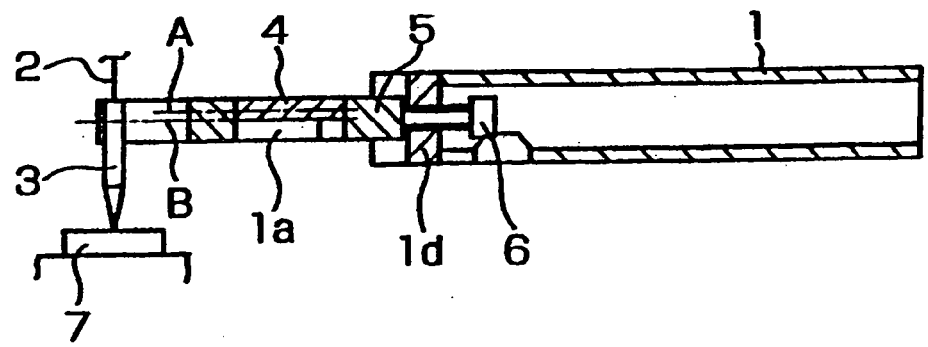
FIG. 1B is a longitudinal sectional view of the bonding arm taken along the axial direction of the bonding arm.
Figure 2:
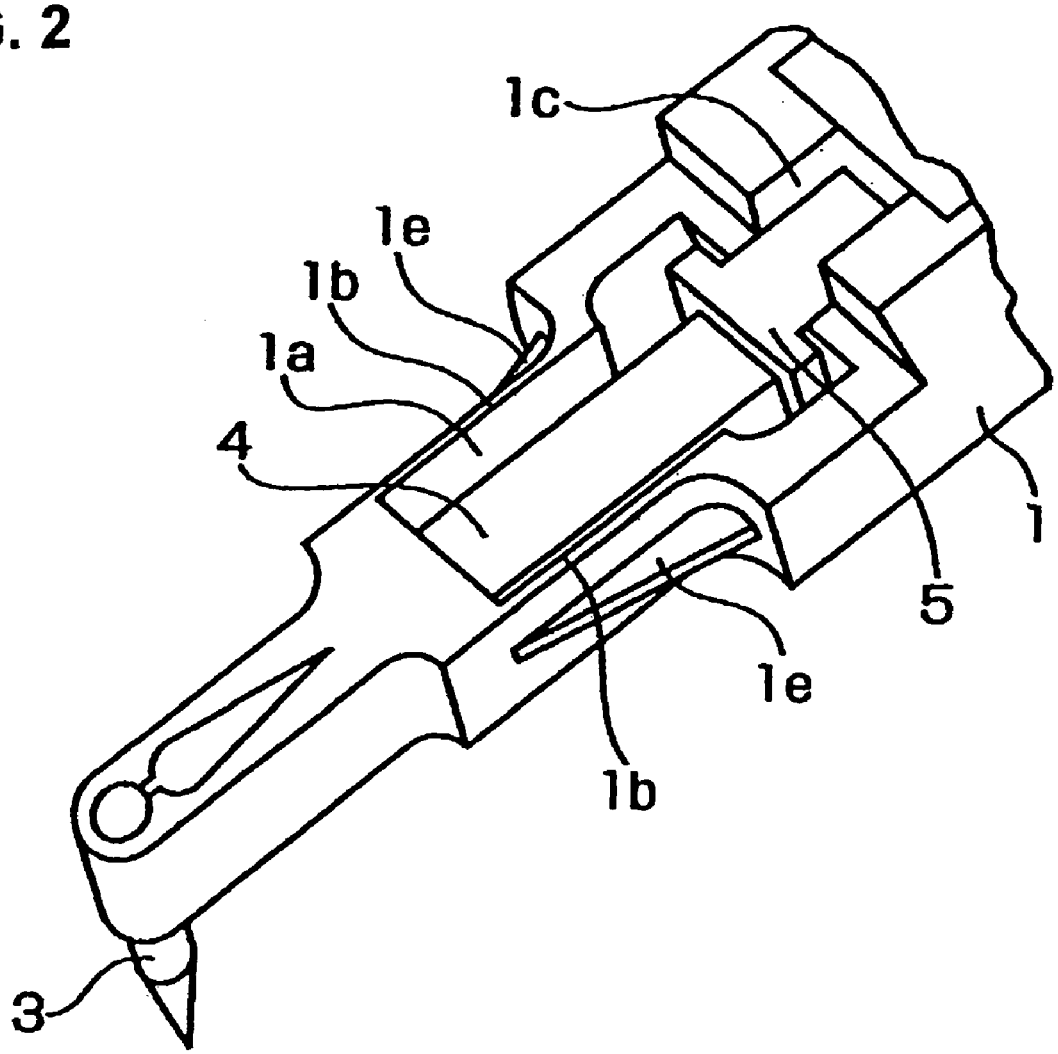
FIG. 2 is an enlarged perspective view of one embodiment of the wire bonding apparatus of the present invention.

One embodiment of the wire bonding apparatus of the present invention will be described with reference to FIGS. 1 and 2.

A capillary 3 through which a wire 2 is passed is fastened to the tip end of a bonding arm 1. A piezoelectric element space 1a is formed in the bonding arm 1 so that the piezoelectric element space 1a is in the vicinity of the attachment portion of the capillary 3. Both sides of the piezoelectric element space 1a form elastic portions 1b which are thin elements. An attachment base space 1c is formed on the rear part of the piezoelectric element space 1a (right side in FIG. 1).

A piezoelectric element 4 and an attachment base 5 are respectively provided in the piezoelectric element space 1a and attachment base space 1c. The piezoelectric element 4 and attachment base 5 are held in the piezoelectric element space 1a and attachment base space 1c.

In order to apply a preparatory pressure to the piezoelectric element 4, a bolt mounting portion 1d is formed in the bonding arm 1 so that the bolt mounting portion 1d is on the rear end of the attachment base 5. A preparatory pressure bolt 6 is screwed into the bolt mounting portion 1d so that the bolt 6 presses the attachment base 5. Accordingly, when the preparatory pressure bolt 6 is turned, a preparatory pressure is applied to the piezoelectric element 4 via the attachment base 5.

The piezoelectric element 4 is provided so that the strain direction of the piezoelectric element 4 is perpendicular to the central axis of the capillary 3 and so that the piezoelectric element 4 expands and contracts in the axial direction of the bonding arm 1. In FIG. 1B, the reference number 7 is a sample or an object of boding.

A voltage with a certain frequency that is controlled by a piezoelectric element control circuit 10 is supplied via a piezoelectric element driving power source 11 to the wirings 4a of the piezoelectric element 4.

The structure described above is substantially the same as the structure of the prior art bonding apparatus described in the "Prior Art".

The piezoelectric element 4 is provided so that a center line A thereof does not coincide with the center line B of the bonding arm 1 as shown in FIG. 1B. In other words, the center line A is positioned above the center line B or is positioned below the center line B. Furthermore, ribs 1e that extend in the horizontal direction are formed on the side surfaces of the elastic portions 1b of the bonding arm 1. The wiring 4a of the piezoelectric element 4 is arranged so that this wiring is connected to the bonding arm control circuit 16 via a detector 15 that detects the voltage or current. Switching between the piezoelectric element driving power source 11 and detector 15 is accomplished by means of a switch 17.

Next, the operation of the above-described structure will be described.

The bonding operation is accomplished by a known method; in other words, the bonding arm 1 is moved in the horizontal plane and raised and lowered, so that the capillary 3 is moved in the horizontal plane and raised and lowered; accordingly, a detailed description of this operation will be omitted.

Prior to the bonding operation, the switch 17 is in a state that connects the wiring 4a of the piezoelectric element 4 to the detector 15. When the capillary 3 is lowered so that the capillary 3 comes into contact with the sample or an object of bonding 7, the capillary 3 receives a reaction force. The reaction force received by the capillary 3 transmits to the piezoelectric element 4.

The characteristic of the piezoelectric element 4 is that a voltage or current is generated when the piezoelectric element 4 receives an expanding or contracting force. Accordingly, by way of observing the gap between the electrodes of the piezoelectric element 4 with the detector 15 prior to the contact of the capillary 3 with the object of bonding, it is possible to detect the changes in the voltage or current by the detector 15 when the capillary 3 contacts the object of bonding. As a result, the bonding arm control circuit 16 makes the lowering motion of the bonding arm 1 gradual or gentle in accordance with signals derived from the changes in this voltage or current.

More specifically, the contact of the capillary 3 with the object of bonding can be instantaneously detected, and the impact load at the time of the contact of the capillary can be reduced. Following the contact, the switch 17 switches to the piezoelectric element driving power source 11 side; subsequently, a voltage at a certain frequency is applied across the wiring 4a of the piezoelectric element 4 from the piezoelectric element driving power source 11 in accordance with the control of the piezoelectric element control circuit 10 in the same manner as in the conventional example. When a voltage is applied to the piezoelectric element 4, then the vibration caused by the expansion and contraction of the piezoelectric element 4 is transmitted to the capillary 3 via the bonding arm 1. By the vibration energy that is transmitted to the capillary 3, the wire 2 is joined or bonded to the sample or the object of bonding 7.

As seen from the above, in the present invention, the piezoelectric element 4 has the function of detecting the contact of the capillary 3 with an object of bonding in addition to the function of transmitting vibration to the capillary 3; accordingly, the contact of the capillary 3 is instantaneously detected, and the impact load at the time of contact can be reduced.

The invention claimed is:

1. A wire bonding apparatus in which a piezoelectric element is provided near a capillary attachment portion of a bonding arm so that said capillary is caused to vibrate in an axial direction of said bonding arm when said piezoelectric element is driven by a piezoelectric element driving power source during bonding of said wire, said wire bonding apparatus is comprising:

a detector for detecting voltage or current generated by said piezoelectric element when said capillary is lowered and contacts an object of bonding, a bonding arm control circuit for controlling lowering of said bonding arm in accordance with changes in the voltage or current detected by said detector, and a switching means that switches said piezoelectric element between said detector for detecting contact and said piezoelectric element driving power source for wire bonding.

2. A wire bonding method in which a piezoelectric element is provided near a capillary attachment portion of a bonding arm so that said capillary is caused to vibrate in an axial direction of said bonding arm when said piezoelectric element is driven by a piezoelectric element driving power source during bonding of said wire, said wire bonding method comprising the steps of:

detecting a voltage or current generated by said piezoelectric element when said capillary is lowered and contacts an object of bonding;

gently lowering said bonding arm following said detection of said voltage or current, thereafter switching said piezoelectric element over to said piezoelectric element driving power source by a switch means so that said piezoelectric element is connected to said piezoelectric element driving power source, and executing wire bonding subsequently while applying driving power to said piezoelectric element so as to vibrate said capillary.

\* \* \* \* \*